US009520169B2

(12) United States Patent
Matsui

(10) Patent No.: US 9,520,169 B2
(45) Date of Patent: Dec. 13, 2016

(54) SEMICONDUCTOR DEVICE

(71) Applicant: PS4 Luxco S.a.r.l., Luxembourg (LU)

(72) Inventor: Yoshinori Matsui, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/769,616

(22) PCT Filed: Feb. 18, 2014

(86) PCT No.: PCT/JP2014/053713
§ 371 (c)(1),
(2) Date: Aug. 21, 2015

(87) PCT Pub. No.: WO2014/129438
PCT Pub. Date: Aug. 28, 2014

(65) Prior Publication Data
US 2015/0380069 A1    Dec. 31, 2015

(30) Foreign Application Priority Data

Feb. 25, 2013    (JP) ................................ 2013-034103

(51) Int. Cl.
*G11C 7/22*         (2006.01)
*G11C 11/4076*     (2006.01)

(52) U.S. Cl.
CPC ............. *G11C 7/222* (2013.01); *G11C 7/22* (2013.01); *G11C 7/225* (2013.01); *G11C 11/4076* (2013.01); *G11C 2207/2272* (2013.01)

(58) Field of Classification Search
CPC .................................... G11C 7/22; G11C 8/18
USPC .............................................. 365/191, 233.5
See application file for complete search history.

(56) References Cited

U.S. PATENT DOCUMENTS

| 2003/0103407 A1* | 6/2003 | Ooishi ................. G11C 7/1045 365/233.12 |
| 2005/0157585 A1* | 7/2005 | Kato ................... G06F 13/4243 365/233.1 |
| 2007/0070005 A1* | 3/2007 | Okamura ............. G09G 3/3666 345/88 |

(Continued)

FOREIGN PATENT DOCUMENTS

| JP | 2003022673 | 1/2003 |
| TW | 368653 | 9/1999 |

OTHER PUBLICATIONS

Application No. PCT/JP2014/053713, International Search Report, Apr. 28, 2014.

*Primary Examiner* — Michael Tran
(74) *Attorney, Agent, or Firm* — Kunzler Law Group, PC

(57) ABSTRACT

One semiconductor device includes a clock signal buffer circuit which, in response to activation of a chip selection signal (CS_n), starts generation of an internal clock signal PCLKAR, and internal circuits which operate in synchronization with the internal clock signal PCLKAR. The clock signal buffer circuit suspends generation of the internal clock signal PCLKAR at a second timing if command signals (CA0 to CA9) indicate read commands, and suspends generation of the internal clock signal PCLKAR at a first timing which is earlier than the second timing if the command signals (CA0 to CA9) indicate active commands. According to one embodiment, an internal clock signal is generated only for periods necessary in accordance with external command signals.

14 Claims, 15 Drawing Sheets

(56) References Cited

U.S. PATENT DOCUMENTS

| | | | |
|---|---|---|---|
| 2007/0201292 A1* | 8/2007 | Matsuzaki | G11C 11/406 365/222 |
| 2007/0297259 A1* | 12/2007 | Miyamoto | G11C 11/22 365/222 |
| 2008/0235528 A1 | 9/2008 | Kim et al. | |
| 2010/0177589 A1* | 7/2010 | Kinoshita | G11C 7/1027 365/233.11 |
| 2012/0008437 A1* | 1/2012 | Fujisawa | G11C 7/1072 365/194 |
| 2012/0069692 A1* | 3/2012 | Taruishi | G11C 7/1066 365/207 |
| 2012/0114086 A1 | 5/2012 | Hayashi | |
| 2012/0120741 A1* | 5/2012 | Kim | G11C 16/08 365/189.14 |
| 2012/0158347 A1* | 6/2012 | Noda | G11C 29/021 702/123 |
| 2012/0210108 A1* | 8/2012 | Ishizuka | G11C 11/419 712/245 |
| 2013/0205100 A1* | 8/2013 | Sato | G06F 13/1605 711/149 |

* cited by examiner

SEMICONDUCTOR DEVICE

TECHNICAL FIELD

The present invention relates to a semiconductor device, and in particular the present invention relates to a semiconductor device comprising internal circuits that operate synchronously with a clock signal.

BACKGROUND

DRAMs (dynamic random access memories) which have come to be widely used in recent years are generally of the synchronous type, operating synchronously with an external clock signal supplied from a memory controller. The external clock signal is supplied to a clock signal generation circuit provided inside the DRAM, and as a result an internal clock signal which is a base clock within the DRAM is generated (see Patent Document 1).

Generally speaking, the internal clock signal is always clocked during normal operation so that it is possible to respond whenever a command is issued and whatever type of command is issued from the memory controller.

Patent Documents

Patent Document 1: JP 2011-108300 A

SUMMARY OF THE INVENTION

Problem to be Solved by the Invention

However, the internal clock signal is supplied to a large number of internal circuits, so when the signal is continuously clocked, a non-negligible amount of current is consumed by the DRAM for which low power consumption is particularly required for mobile applications and the like.

Means for Solving the Problem

A semiconductor device according to one aspect of the present invention is characterized in that it comprises: a first circuit for generating a second clock signal in accordance with a first clock signal; and a second circuit for generating an internal command signal synchronous with the second clock signal in accordance with an external command signal input synchronously with the first clock signal, wherein, when the external command signal exhibits a first value, the first circuit stops the second clock signal in response to a first period having elapsed from input of the external command signal, and when the external command signal exhibits a second value different than the first value, the first circuit stops the second clock signal in response to a second period longer than the first period having elapsed from input of the external command signal.

The semiconductor device according to another aspect of the present invention is characterized in that it comprises: a clock signal buffer circuit for starting generation of an internal clock signal in response to activation of a chip select signal; and an internal circuit which operates synchronously with the internal clock signal, wherein, when a command signal input synchronously with the chip select signal shows a predetermined command, the clock signal buffer circuit stops generation of the internal clock signal at a second timing, and when the command signal shows a different command than the abovementioned predetermined command, the clock signal buffer circuit stops generation of the internal clock signal at a first timing which is earlier than the second timing.

The semiconductor device according to a further aspect of the present invention is characterized in that it comprises: a clock signal generation circuit for generating an internal clock on the basis of an external clock; a clock buffer circuit for buffering and outputting the internal clock; and a command decoding circuit for decoding a command supplied from the outside and generating a decoded signal, in accordance with the internal clock output from the clock buffer circuit, wherein the clock buffer circuit outputs the internal clock signal in accordance with a chip select signal, and stops output of the internal clock signal in accordance with the command decoded signal.

Advantage of the Invention

According to the present invention, an internal clock signal is generated in accordance with an external command signal only in a required period, so it is possible to reduce the current consumption.

MODE OF EMBODIMENT OF THE INVENTION

A preferred mode of embodiment of the present invention will be described in detail below with reference to the appended figures.

Figure 1:
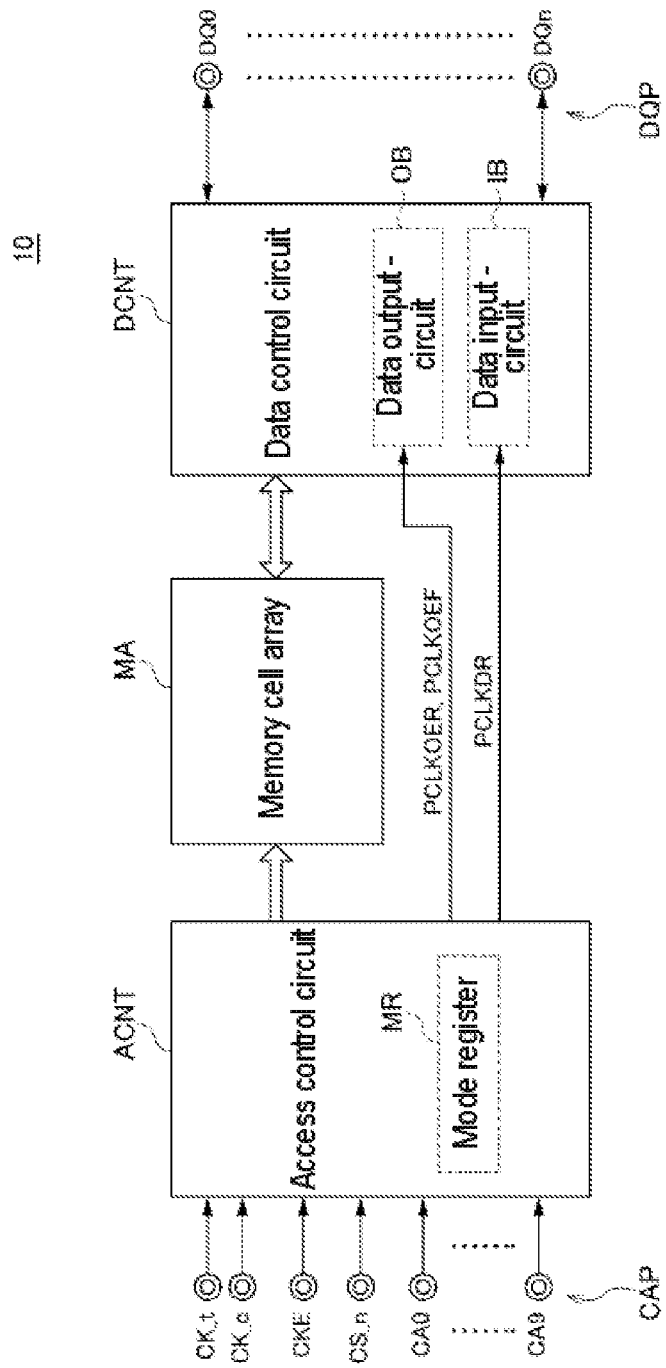
FIG. 1 is a block diagram showing the circuit configuration of a semiconductor device 10 according to a preferred mode of embodiment of the present invention.

FIG. 1 is a block diagram showing the circuit configuration of a semiconductor device 10 according to a preferred mode of embodiment of the present invention.

The semiconductor device 10 according to this mode of embodiment is a DRAM which is stacked on one silicon chip CP, and it comprises a memory cell array MA including a plurality of memory cells, as shown in FIG. 1. The memory cell array MA is accessed by means of an access control circuit ACNT. During a read operation, read data is read out from the memory cell array MA on the basis of control performed by the access control circuit ACNT, and read data DQ0-DQn is output from a data terminal DQP via a data output circuit OB included in a data control circuit DCNT. The read data DQ0-DQn is output synchronously with output clock signals PCLKOER and PCLKOEF. Furthermore, during a write operation, write data DQ0-DQn input to a data terminal DQP is taken in to a data input circuit IB synchronously with an input clock signal PCLKDR and written to the memory cell array MA.

As shown in FIG. 1, complementary external clock signals CK_t, CK_c, a clock enable signal CKE, a chip select signal CS_n and command addresses CA0-CA9 etc. are input to the access control circuit ACNT via a command address terminal CAP. Furthermore, the access control circuit ACNT is provided with a mode register MR for holding a mode signal showing an operating mode of the semiconductor device 10. As will be described later, a set value of the mode register MR can be read from the data terminal DQP by issuing a mode register read command from the outside.

The circuit configuration of the access control circuit ACNT will be described in detail below.

Figure 2:
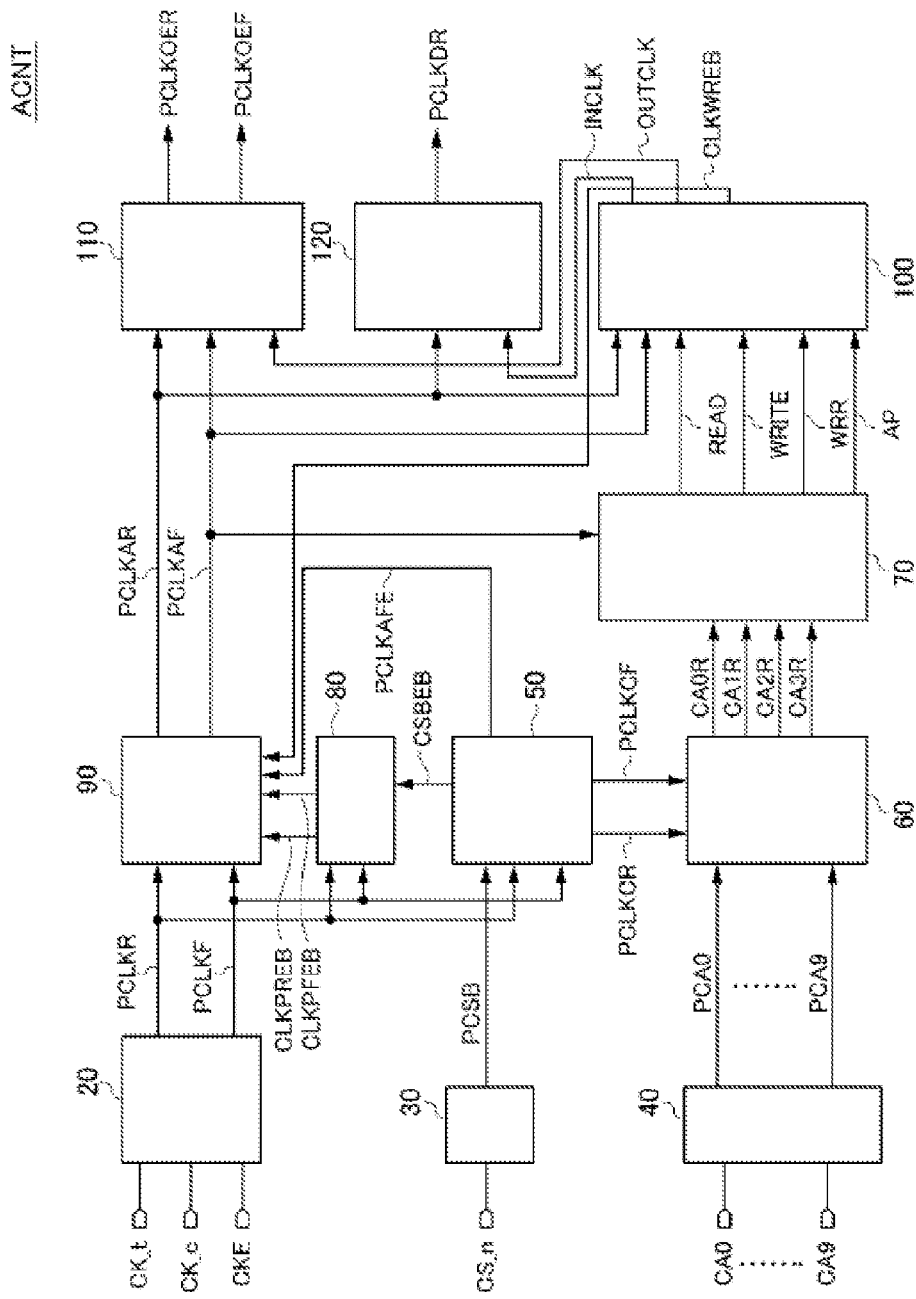
FIG. 2 is a block diagram showing the configuration of the main parts of an access control circuit ACNT.

FIG. 2 is a block diagram showing the configuration of the main parts of the access control circuit ACNT.

As shown in FIG. 2, the access control circuit ACNT comprises a clock signal generation circuit 20, a chip select receiver circuit 30, and a command address receiver circuit 40. The clock signal generation circuit 20 receives the external clock signals CK_t, CK_c and the clock enable signal CKE, and generates complementary internal clock signals PCLKR, PCLKF accordingly. Furthermore, the chip select receiver circuit 30 receives a chip select signal CS and generates a chip select signal PCSB. In addition, the command address receiver circuit 40 receives command address signals CA0-CA9 and generates command address signals PCA0-PCA9.

Figure 3:
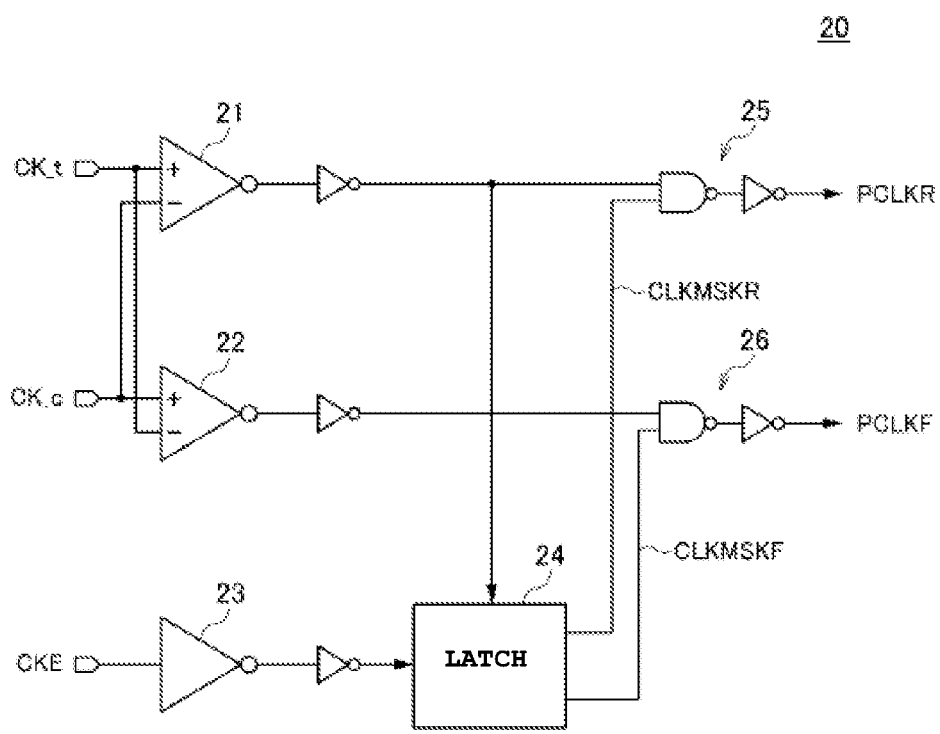
FIG. 3 is a circuit diagram of a clock signal generation circuit 20.

FIG. 3 is a circuit diagram of the clock signal generation circuit 20.

As shown in FIG. 3, the clock signal generation circuit 20 comprises a pair of receiver circuits 21, 22 for receiving the complementary external clock signals CK_t, CK_c, and a receiver circuit 23 for receiving the clock enable signal CKE. In the receiver circuit 21, the external clock signal CK_t is supplied to a non-inverting input node (+) and the external clock signal CK_c is supplied to an inverting input node (−), whereas in the receiver circuit 22, the external clock signal CK_c is supplied to a non-inverting input node (+) and the external clock signal CK_t is supplied to an inverting input node (−).

Furthermore, an output signal of the receiver circuit 23 is taken in to a latch circuit 24 synchronously with an output signal of the receiver circuit 21, in other words synchronously with the rising edge of the external clock signal CK_t. The latch circuit 24 generates mask signals CLKMSKR, CLKMSKF in accordance with logic of the latched clock enable signal CKE. The mask signals CLKMSKR, CLKMSKF are supplied to gate circuits 25, 26 for receiving output signals of the receiver circuits 21, 22, respectively, and output signals of the gate circuits 25, 26 are each used as internal clock signals PCLKR, PCLKF.

By virtue of this configuration, if the logic level of the clock enable signal CKE which is synchronous with the rising edge of the external clock signal CK_t is a high level, the internal clock signals PCLKR, PCLKF having substantially the same phase as the external clock signals CK_t, CK_c are generated. On the other hand, if the logic level of the clock enable signal CKE which is synchronous with the rising edge of the external clock signal CK_t is a low level, clocking of the internal clock signals PCLKR, PCLKF is stopped.

Figure 4:
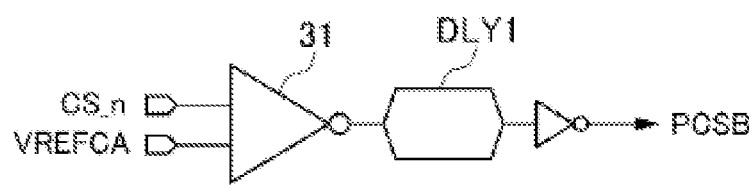
FIG. 4 is a circuit diagram of a chip select receiver circuit 30.
Figure 5:
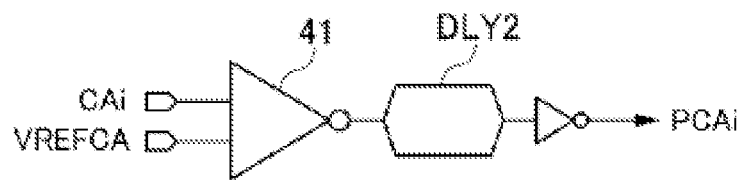
FIG. 5 is a circuit diagram of a command address receiver circuit 40.

FIG. 4 and FIG. 5 are circuit diagrams showing the chip select receiver 30 and the command address receiver circuit 40, respectively.

As shown in FIG. 4 and FIG. 5, the chip select receiver circuit 30 and the command address receiver circuit 40 have similar circuit configurations and are provided with receiver circuits 31, 41 for comparing a corresponding signal CS_n or CAi (i=0-9) and a reference potential VREFCA, and delay circuits DLY1, DLY2 for delaying the respective output signals of the receiver circuits 31, 41. As shown in FIG. 4, an output signal of the delay circuit DLY1 is used as the chip select signal PCSB. Furthermore, as shown in FIG. 5, an output signal of the delay circuit DLY2 is used as a command address signal PCAi.

Returning to FIG. 2, the access control circuit ACNT includes a chip select latch circuit 50 which receives the internal clock signals PCLKR, PCLKF and the chip select signal PCSB. The chip select latch circuit 50 generates enable signals PCLKCR, PCLKCF, PCLKAFE and an internal chip select signal CSBEB on the basis of the abovementioned signals. Among these signals, the enable signals PCLKCR, PCLKCF are supplied to a command address latch circuit 60, the internal chip select signal CSBEB is supplied to a clock enable signal generation circuit 80, and the enable signal PCLKAFE is supplied to a clock signal buffer circuit 90.

Figure 6:
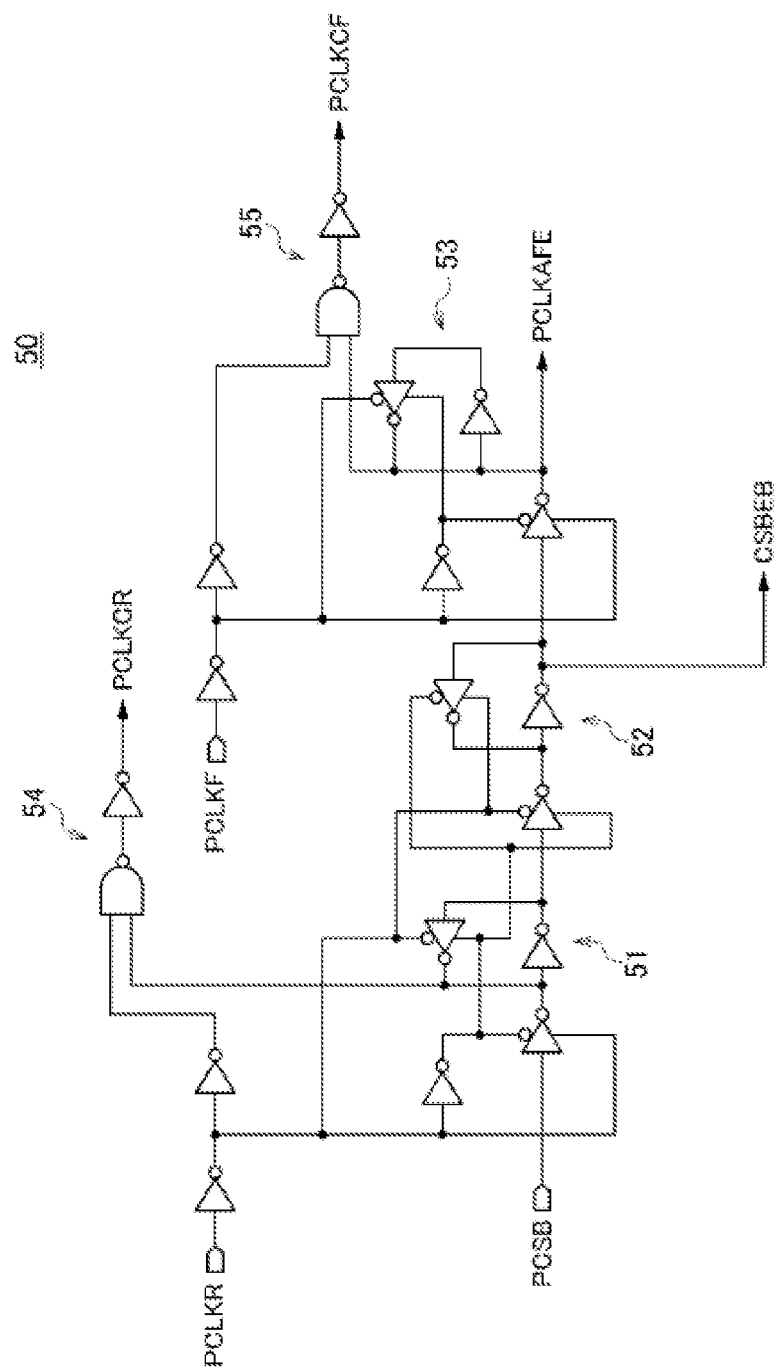
FIG. 6 is a circuit diagram of a chip select latch circuit 50.

FIG. 6 is a circuit diagram of the chip select latch circuit 50.

As shown in FIG. 6, the chip select latch circuit 50 comprises cascade-connected latch circuits 51-53. The latch circuit 51 latches the chip select signal PCSB synchronously with the internal clock signal PCLKR, and an output signal thereof is output as the enable signal PCLKCR via a gate circuit 54. Furthermore, the output signal of the latch circuit 51 is latched to the latch circuit 52 synchronously with the internal clock signal PCLKR and the output signal thereof is output as the internal chip select signal CSBEB and the enable signal PCLKAFE. In addition, the output signal of the latch circuit 52 is latched to the latch circuit 53 synchronously with the internal clock signal PCLKF and the output signal thereof is output as the enable signal PCLKCF via a gate circuit 55.

By virtue of this configuration, when the chip select signal PCSB is activated to low level, the enable signal PCLKCR is activated for 0.5 clock cycles synchronously with the internal clock signal PCLKR, and the enable signal PCLKCF is activated for 0.5 clock cycles synchronously with the internal clock signal PCLKF, while the internal chip select signal CSBEB and the enable signal PCLKAFE are activated for one clock cycle.

Among the signals generated by means of the chip select latch circuit 50, the enable signals PCLKCR, PCLKCF are supplied to the command address latch circuit 60 shown in FIG. 2.

Figure 7:
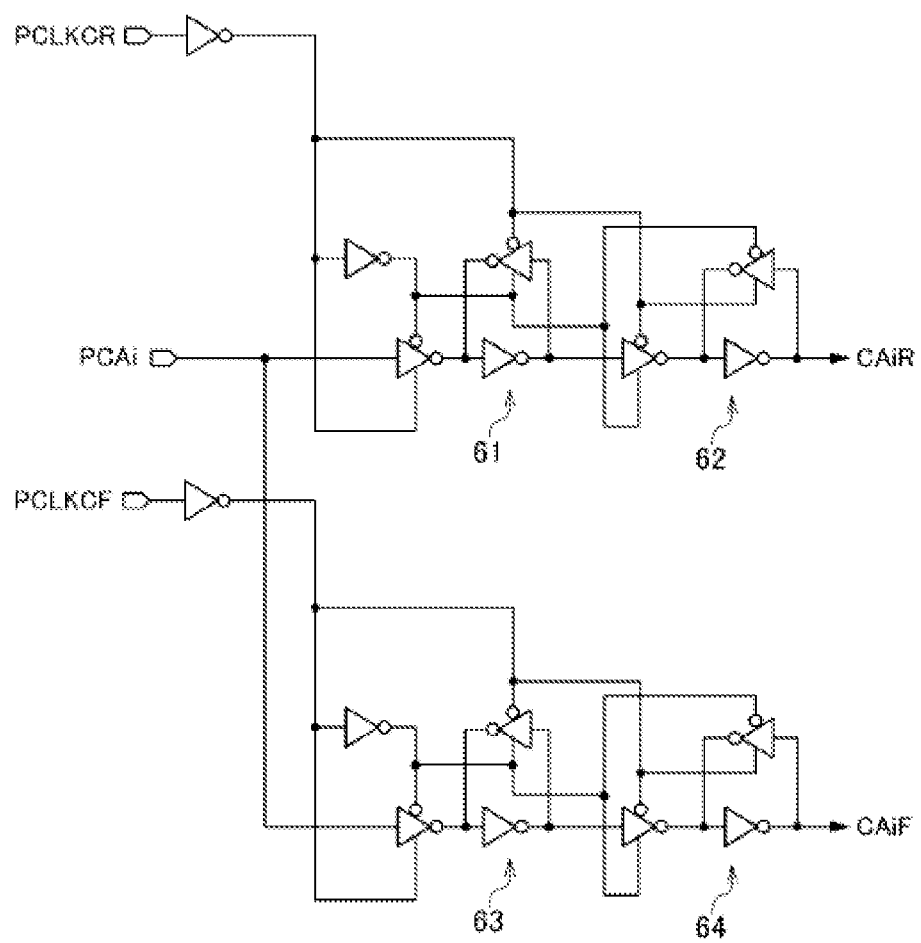
FIG. 7 is a circuit diagram of a command address latch circuit 60.

FIG. 7 is a circuit diagram of the command address latch circuit 60.

As shown in FIG. 7, the command address latch circuit 60 comprises cascade-connected latch circuits 61, 62 for performing latch operations synchronously with the enable signal PCLKCR, and cascade-connected latch circuits 63, 64 for performing latch operations synchronously with the enable signal PCLKCF. The command address signal PCAi is input to both of the initial-stage latch circuits. By virtue of this configuration, the command address signal CAi issued synchronously with the enable signal PCLKCR, i.e. synchronously with the rising edge of the external clock signal CK_t, is output from the latch circuit 62 as a command address signal CAiR. Meanwhile, the command address signal CAi issued synchronously with the enable signal PCLKCF, i.e. synchronously with the rising edge of the external clock signal CK_c (the falling edge of the external clock signal CK_t) is output from the latch circuit 64 as a command address signal CAiF.

The command address signals CAiR, CAiF separated in this way are supplied to a command decoder 70 shown in FIG. 2.

Figure 8:
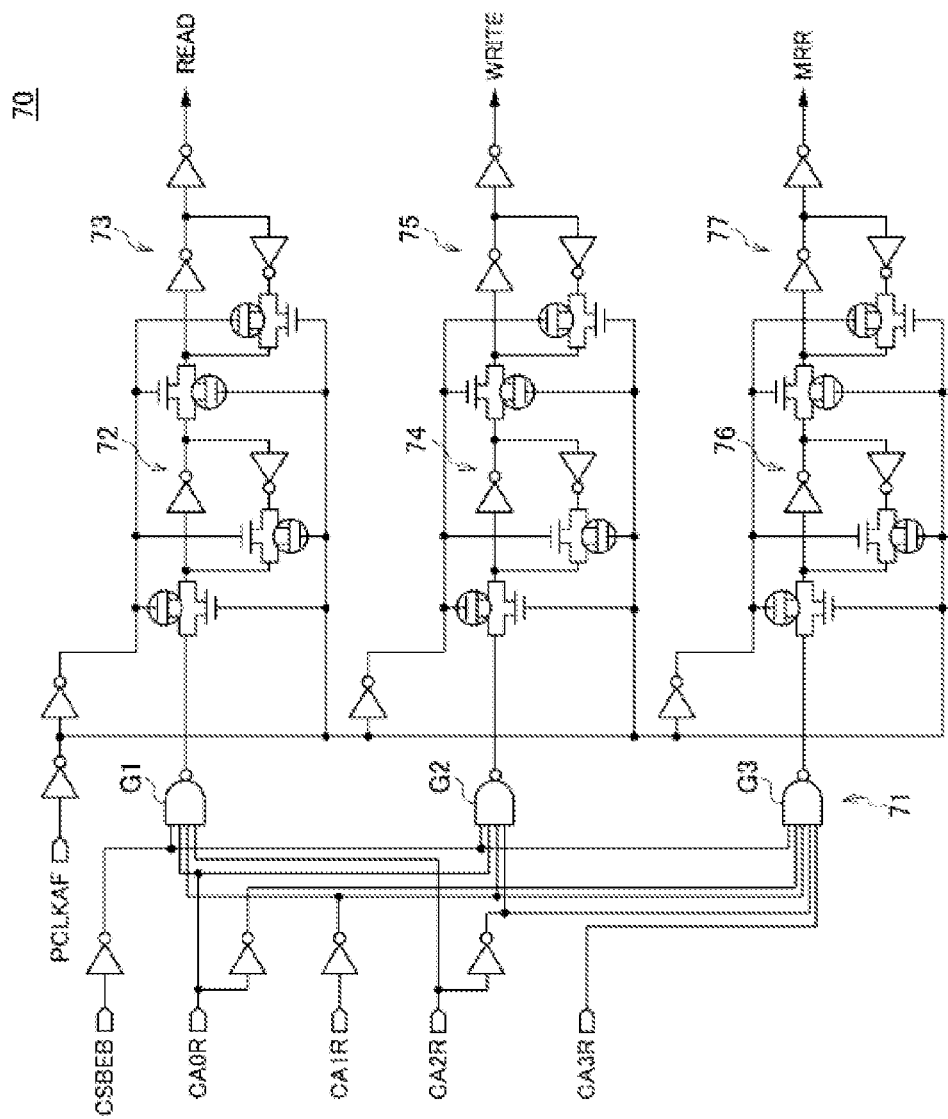
FIG. 8 is a circuit diagram showing part of a command decoder 70.

FIG. 8 is a circuit diagram showing part of the command decoder 70.

As shown in FIG. 8, the command decoder 70 comprises a decoding circuit unit 71 for decoding command address signals CA0R-CA3R, and latch circuits 72-77 for performing latch operations synchronously with an internal clock signal PCLKAF. The internal clock signal PCLKAF is generated by means of the clock signal buffer circuit 90 shown in FIG. 2 which will be described in detail later.

The decoding circuit unit 71 includes gate circuits G1-G3 which are activated by means of the internal chip select signal CSBEB. The command address signals CA0R-CA3R are input to the gate circuits G1-G3 with different logic, and as a result output signals of the corresponding gate circuits G1-G3 are activated at low level when the command address signals CA0R-CA3R exhibit a predetermined value.

As shown in FIG. 8, an output signal of the gate circuit G1 is supplied to the cascade-connected latch circuits 72, 73, and said output signal is used as a read signal READ. Furthermore, an output signal of the gate circuit G2 is supplied to the cascade-connected latch circuits 74, 75, and said output signal is used as a write signal WRITE. In addition, an output signal of the gate circuit G3 is supplied to the cascade-connected latch circuits 76, 77, and said output signal is used as a mode register read signal MRR. The read command READ, write command WRITE and mode register read command MRR are supplied to a latency control circuit 100 shown in FIG. 2.

When the read command READ, write command WRITE and mode register read command MRR have been activated, the latency control circuit 100 activates enable signals CLKWREB, OUTCLKE, INCLKE for a predetermined period in accordance with the latency set in the mode register MR. As shown in FIG. 2, the enable signals CLKWREB, OUTCLKE, INCLKE are supplied to the clock signal buffer circuit 90, an output clock generation circuit 110 and an input clock generation circuit 120.

Figure 12:
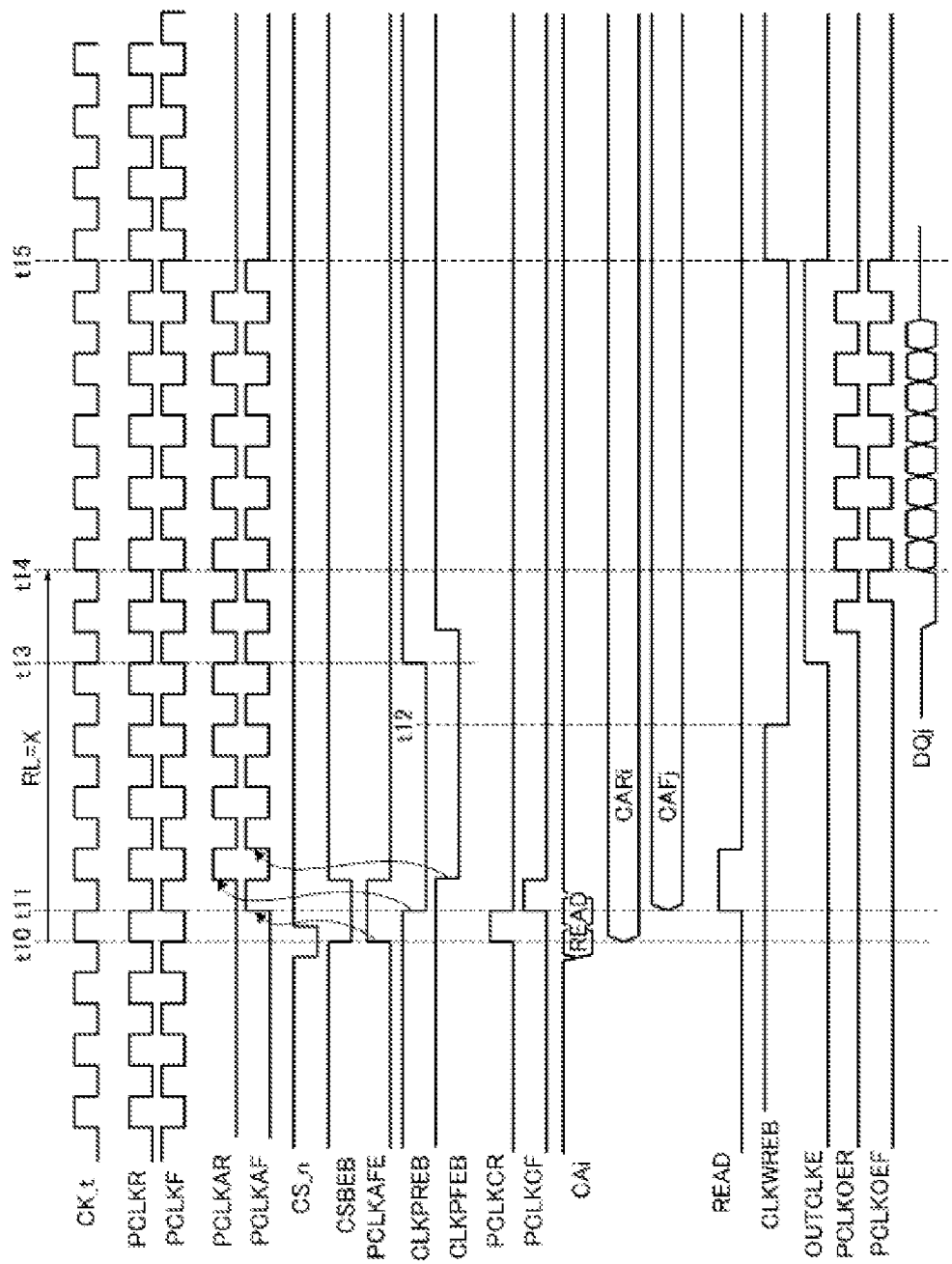
FIG. 12 is a timing chart showing operation when a read command has been issued from the outside.

For example, when the read signal READ has been activated, as shown in FIG. 12, the enable signals CLKWREB, OUTCLKE are activated in succession, and both are inactivated after the read operation has been completed. When the enable signal OUTCLKE is activated, the output clock generation circuit 110 generates output clock signals PCLKOER, PCLKOEF in accordance with internal clock signals PCLKAR, PCLKAF. The output clock signals PCLKOER, PCLKOEF are supplied to the data output circuit OB shown in FIG. 1, and the data output circuit OB performs burst-output of read data DQj (j=0-n) synchronously with the output clock signals PCLKOER, PCLKOEF.

Figure 14:
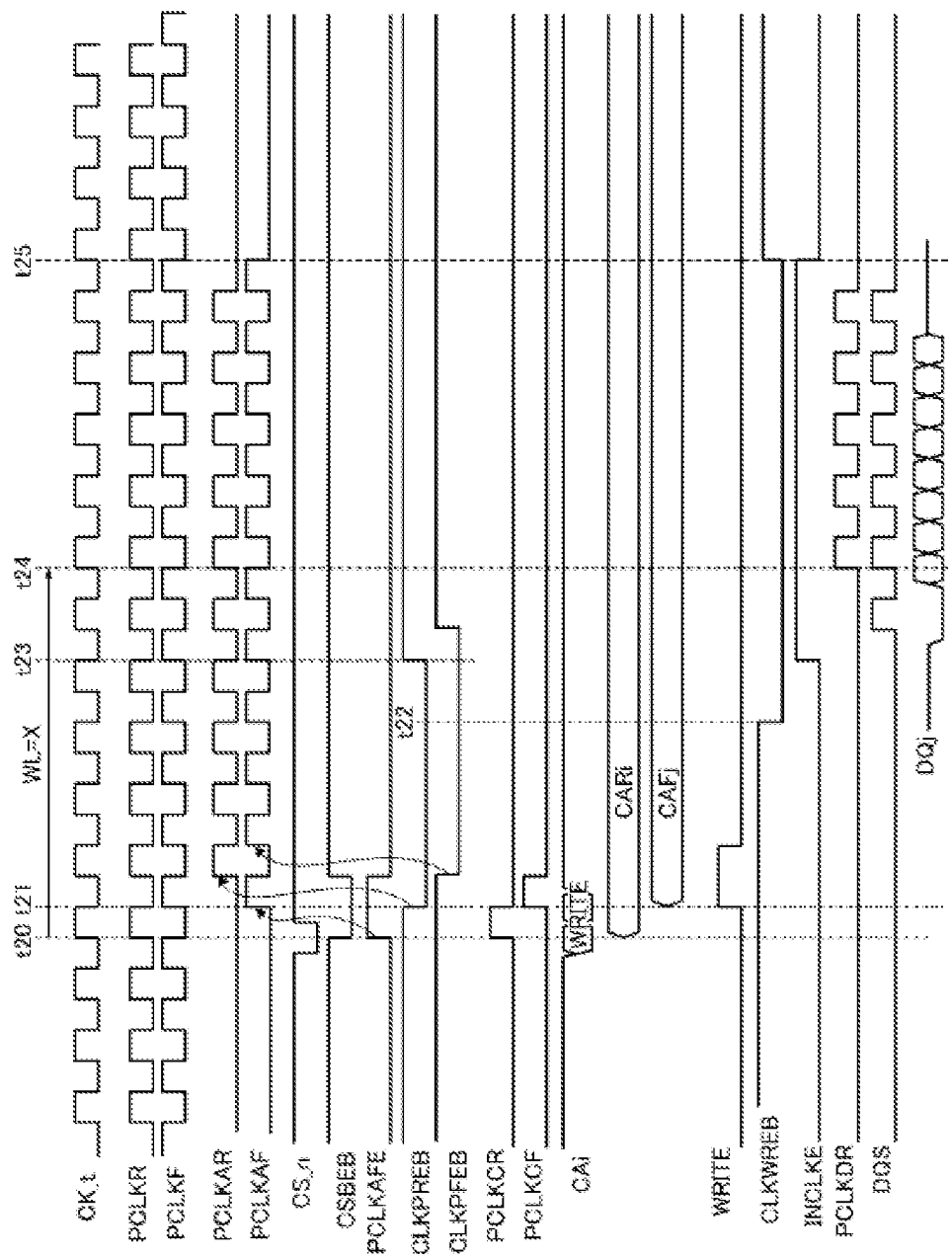
FIG. 14 is a timing chart showing operation when a write command has been issued from the outside.

Furthermore, when the write signal WRITE has been activated, as shown in FIG. 14, the enable signals CLKWREB, INCLKE are activated in succession, and both are inactivated after the write operation has been completed. When the enable signal INCLKE is activated, the input clock generation circuit 120 generates the input clock signal PCLKDR in accordance with the internal clock signal PCLKAR. The input clock signal PCLKDR is supplied to the data input circuit IB shown in FIG. 1, and the data input circuit IB takes in the burst-input write data DQj synchronously with the input clock signal PCLKDR.

Figure 13:
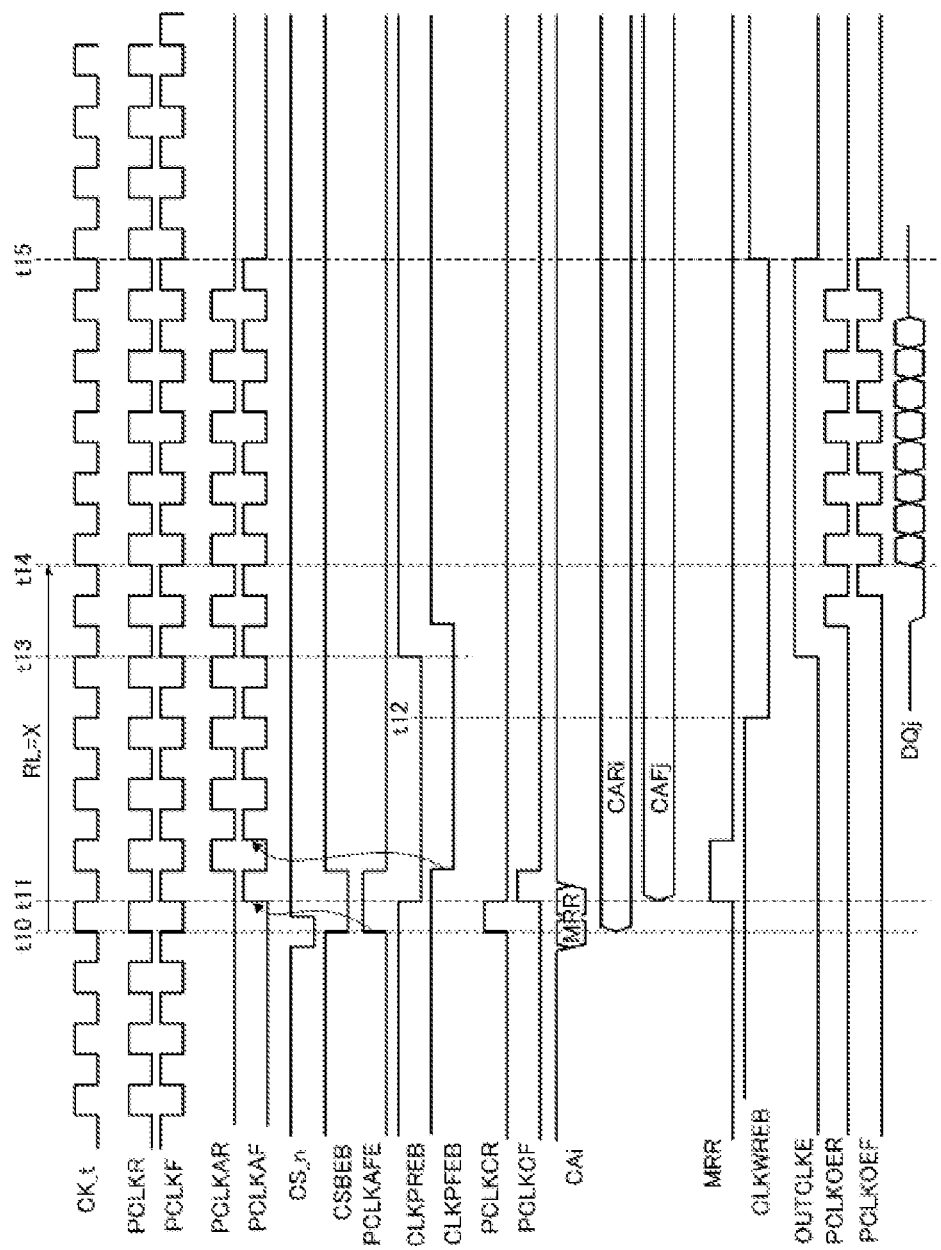
FIG. 13 is a timing chart showing operation when a mode register read command has been issued from the outside.

In addition, when the mode register read signal MRR has been activated, as shown in FIG. 13, the enable signals CLKWREB, OUTCLKE are activated in succession, and both are inactivated after the mode register read operation has been completed. As a result, burst-output of a set value of the mode register MR is performed synchronously with the output clock signals PCLKOER, PCLKOEF, in the same way as when the read signal READ has been activated.

Figure 9:
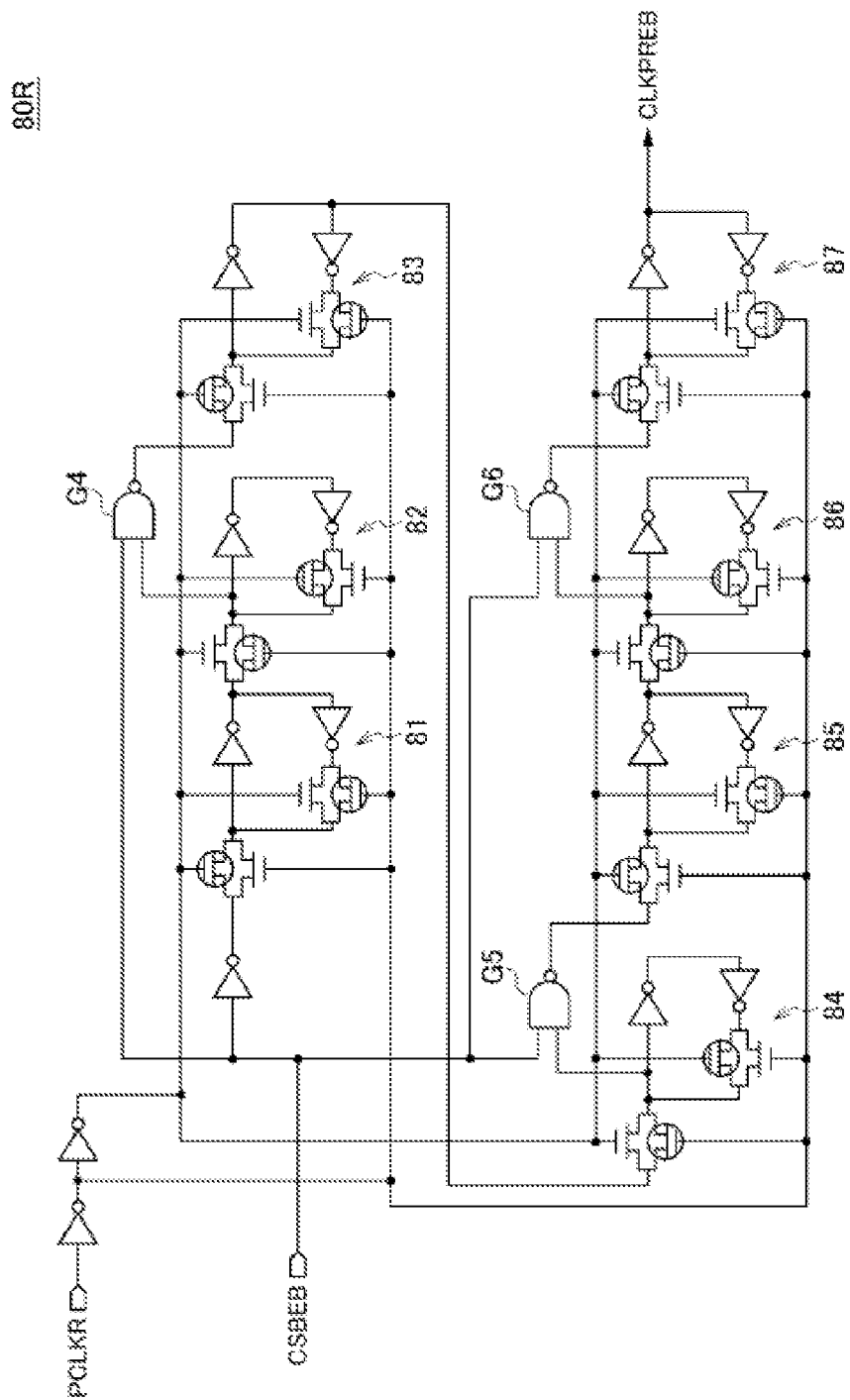
FIG. 9 is a circuit diagram showing a circuit portion 80R which operates synchronously with an internal clock signal PCLKR, in a clock enable signal generation circuit 80.
Figure 10:
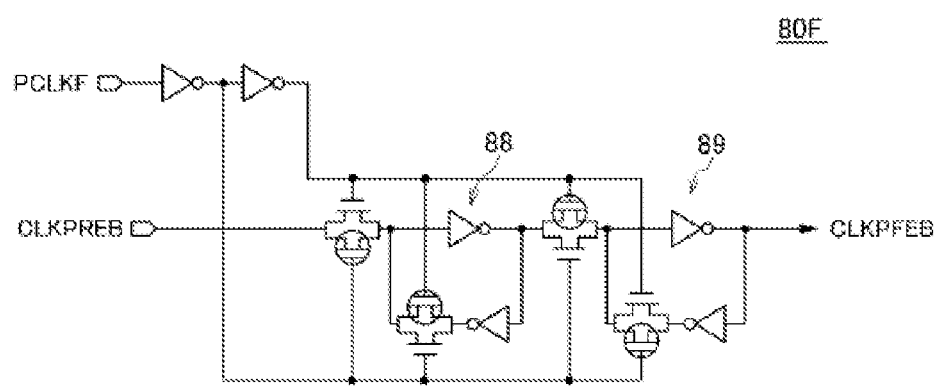
FIG. 10 is a circuit diagram showing a circuit portion 80F which operates synchronously with an internal clock signal PCLKF, in the clock enable signal generation circuit 80.

FIG. 9 and FIG. 10 are circuit diagrams of the clock enable signal generation circuit 80, where FIG. 9 shows a circuit portion 80R which operates synchronously with an internal clock signal PCLKR, and FIG. 10 shows a circuit portion 80F which operates synchronously with an internal clock signal PCLKF.

As shown in FIG. 9, the circuit portion 80R of the clock enable signal generation circuit 80 comprises cascade-connected latch circuits 81-87 which receive the internal chip select signal CSBEB. The latch circuits 81-87 all operate synchronously with the internal clock signal PCLKR. Here, the latch circuit 82 and the latch circuit 83, the latch circuit 84 and the latch circuit 85, and the latch circuit 86 and the latch circuit 87 are connected via respective gate circuits G4-G6, the gate circuits G4-G7 being constructed in such a way as to be activated by the internal chip select signal CSBEB. By virtue of this configuration, when the internal chip select signal CSBEB is activated at low level, an enable signal CLKPREB having a pulse width of four clock cycles is generated from the final latch circuit 87, as shown in FIG. 12 to FIG. 16.

The enable signal CLKPREB is supplied to the clock signal buffer circuit 90 shown in FIG. 2, and is also supplied to the circuit portion 80F of the clock enable signal generation circuit 80 shown in FIG. 10. As shown in FIG. 10, the circuit portion 80F of the clock enable signal generation circuit 80 comprises cascade-connected latch circuits 88, 89 which receive the enable signal CLKPREB. The latch circuits 88, 89 both operate synchronously with the internal clock signal PCLKF. By virtue of this configuration, an enable signal CLKPFEB output from the final-stage latch circuit 89 has a waveform delayed by 0.5 clock cycles with respect to the enable signal CLKPREB as shown in FIG. 12 to FIG. 16. The enable signal CLKPFEB is supplied to the clock signal buffer circuit 90 shown in FIG. 2.

Figure 11:
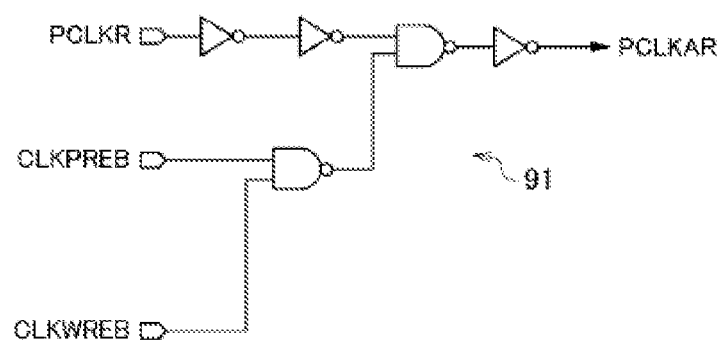
FIG. 11 is a circuit diagram of a clock signal buffer circuit 90.
Figure 11:
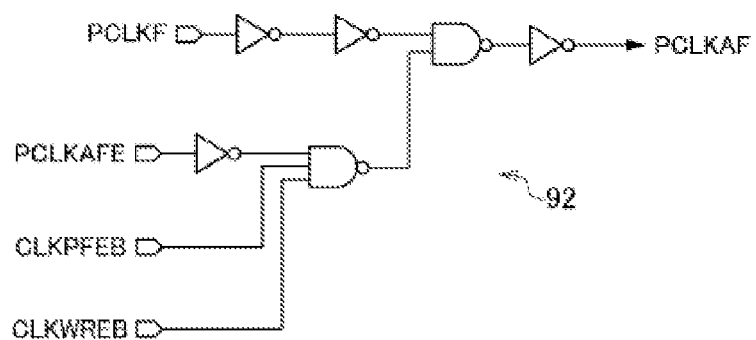

FIG. 11 is a circuit diagram of the clock signal buffer circuit 90.

As shown in FIG. 11, the clock signal buffer circuit 90 comprises a gate circuit 91 for generating the internal clock signal PCLKAR which is synchronous with the internal clock signal PCLKR, and a gate circuit 92 for generating the internal clock signal PCLKAF which is synchronous with the internal clock signal PCLKF.

The gate circuit 91 clocks the internal clock signal PCLKAR synchronously with the internal clock signal PCLKR, on the condition that the enable signal CLKPREB and/or the enable signal CLKWREB is activated at low level. In other words, when the enable signals CLKPREB and CLKWREB are both inactivated, clocking of the internal clock signal PCLKAR is stopped.

The gate circuit 92 clocks the internal clock signal PCLKAF synchronously with the internal clock signal PCLKF, on the condition that the enable signal CLKPFEB and/or the enable signal CLKWREB is activated at low level. In other words, when the enable signals CLKPFEB and CLKWREB are both inactivated, clocking of the internal clock signal PCLKAF is stopped. Furthermore, the enable signal PCLKAFE is also input to the gate circuit 92, and clocking of the internal clock signal PCLKAF is stopped for the period in which the enable signal PCLKAFE is activated at high level.

The description given above relates to the circuit configuration of the semiconductor device 10 according to this mode of embodiment. The operation of the semiconductor device 10 according to this mode of embodiment will be described next.

FIG. 12 is a timing chart showing operation when a read command has been issued from the outside.

In the example shown in FIG. 12, the command address signal CAi is input at the times t10, t11 and this indicates a read command. Furthermore, when the rising edge of the external clock signal CK_t at the time t10 is apparent, the chip select signal CS_n is activated at low level. The chip select signal CSBEB and the enable signal PCLKAFE are activated throughout a period of one clock cycle in response to activation of the chip select signal CS_n, and the enable signals PCLKCR, PCLKCF are also activated throughout a period of 0.5 clock cycles.

In addition, the enable signals CLKPREB, CLKPFEB are activated throughout a period of four clock cycles in response to activation of the chip select signal CSBEB. By means of these, the clock signal buffer circuit 90 is placed in an enabled state, so clocking of the internal clock signals PCLKAR, PCLKAF is started, as shown in FIG. 12. Furthermore, the command decoder 70 activates the read signal READ in response to the issue of a read command. When the read signal READ is activated, the latency control circuit 100 activates the enable signals CLKWREB, OUTCLKE in succession.

Clocking of the internal clock signals PCLKAR, PCLKAF is continued as long as the enable signals CLKPREB, CLKPFEB are activated at low level, but as shown in FIG. 12, when the time t13 at which four clock cycles have elapsed from the time t11 is reached, the enable signal CLKPREB is inactivated at high level. 0.5 clock cycles after, the enable signal CLKPFEB is likewise inactivated at high level.

However, at the time t12 which is the timing prior to the time t13, the latency control circuit 100 activates the enable signal CLKWREB to low level, so the clock signal buffer circuit 90 is held in an enabled state and clocking of the internal clock signals PCLKAR, PCLKAF is continued.

After this, when the time t14 at which the read latency (RL=X) has elapsed is reached, burst-output of the read data DQj is started. The burst-output of the read data DQj is performed synchronously with the output clock signals PCLKOER, PCLKOEF generated by means of the output clock generation circuit 110. Clocking of the output clock signals PCLKOER, PCLKOEF is started by activation of the enable signal OUTCLKE, and when the time t15, which is after completion of the burst-output of the read data DQj, is reached the enable signals CLKWREB, OUTCLKE are both inactivated.

When the enable signal CLKWREB is inactivated, the clock signal buffer circuit 90 is changed to a disabled state so clocking of the internal clock signals PCLKAR, PCLKAF is stopped. The series of read operations is completed by means of the process described above.

In this way, when a read command has been issued, the internal clock signals PCLKAR, PCLKAF are clocked only in the period of the times t11-t15, so it is possible to minimize consumption of current produced by generation of the internal clock signals PCLKAR, PCLKAF. Moreover, the clock signal buffer circuit 90 which generates the internal clock signals PCLKAR, PCLKAF is in an enabled state due to the enable signal CLKPREB in the period of the times t11-t13, and is in an enabled state due to the enable signal CLKWREB in the period of the times t12-t15, so the internal clock signals PCLKAR, PCLKAF can be generated without interruption.

FIG. 13 is a timing chart showing operation when a mode register read command has been issued from the outside.

As shown in FIG. 13, the operation when a mode register read command has been issued is the same as the operation when a read command has been issued (times t10-t15), except that the command decoder 70 generates the mode register read signal MRR. When the mode register read signal MRR is activated, a read operation is implemented for the mode register MR instead of a read operation for the memory cell array MA, and the set value of the mode register MR is burst-output as a result.

FIG. 14 is a timing chart showing operation when a write command has been issued from the outside.

In the example shown in FIG. 14, the command address signal CAi is input at the times t20, t21, and this shows a write command. The operation when a write command has been issued is essentially the same as the operation when a read command has been issued, but the write signal WRITE is activated by means of the command decoder 70. When the write signal WRITE is activated, the latency control circuit 100 activates the enable signals CLKWREB, INCLKE in succession.

When the time t24 at which the write latency (WL=X) has elapsed is reached, burst-input of the write data DQj is started. The burst-input write data DQj is taken in synchronously with the input clock signal PCLKDR. Clocking of the input clock signal PCLKDR is started by activation of the enable signal INCLKE, and when the time t25, which is after completion of burst-input of the write data DQj, is reached the enable signals CLKWREB, INCLKE are both inactivated.

In this way, even if a write command has been issued, the clock signal buffer circuit 90 is placed in an enabled state due to the enable signal CLKPREB in the period of the times t21-t23, and is placed in an enabled state due to the enable signal CLKWREB in the period of the times t22-t25, so the internal clock signals PCLKAR, PCLKAF can be generated without interruption.

Figure 15:
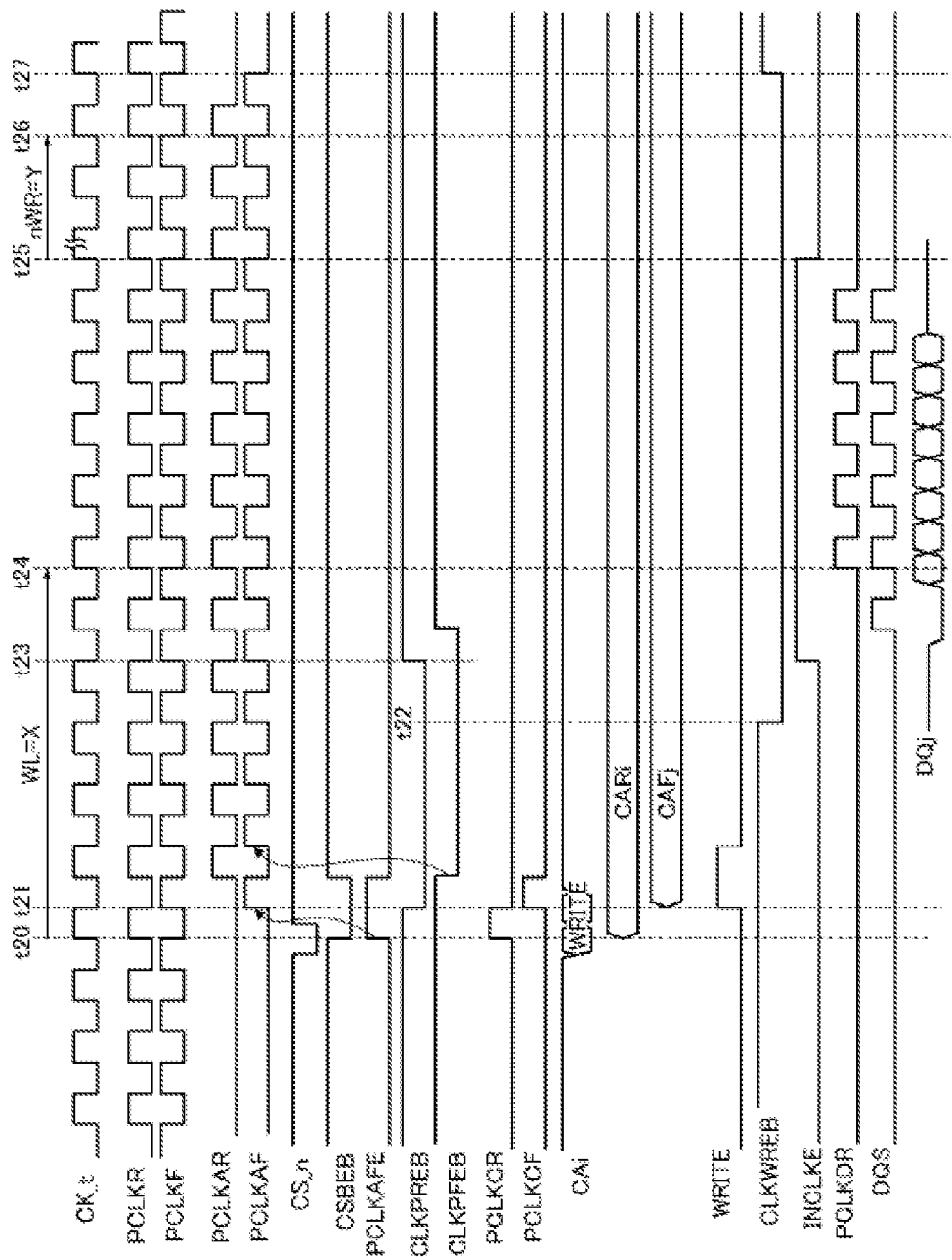
FIG. 15 is a timing chart showing operation when a write with auto-precharge command has been issued from the outside.

FIG. 15 is a timing chart showing operation when a write with auto-precharge command has been issued from the outside. A "write with auto-precharge command" is a command for executing a write operation while also automatically executing a precharge operation after the write operation has been completed.

As shown in FIG. 15, when a write with auto-precharge command has been issued, the operation is the same as when a write command has been issued with regard to the write operation (times t20-t25). However, when a write with auto-precharge command has been issued, the latency control circuit 100 also continues to activate the enable signal CLKWREB to low level after the time t25 at which the write operation was completed, and the enable signal CLKWREB is placed in an active state from the time t26 at which a write recovery period nWR has elapsed from the time t25, until the time t27 at which one further clock cycle has elapsed. As a result, clocking of the internal clock signals PCLKAR, PCLKAF can be continued until the time t27 at which the precharge operation is completed.

Figure 16:
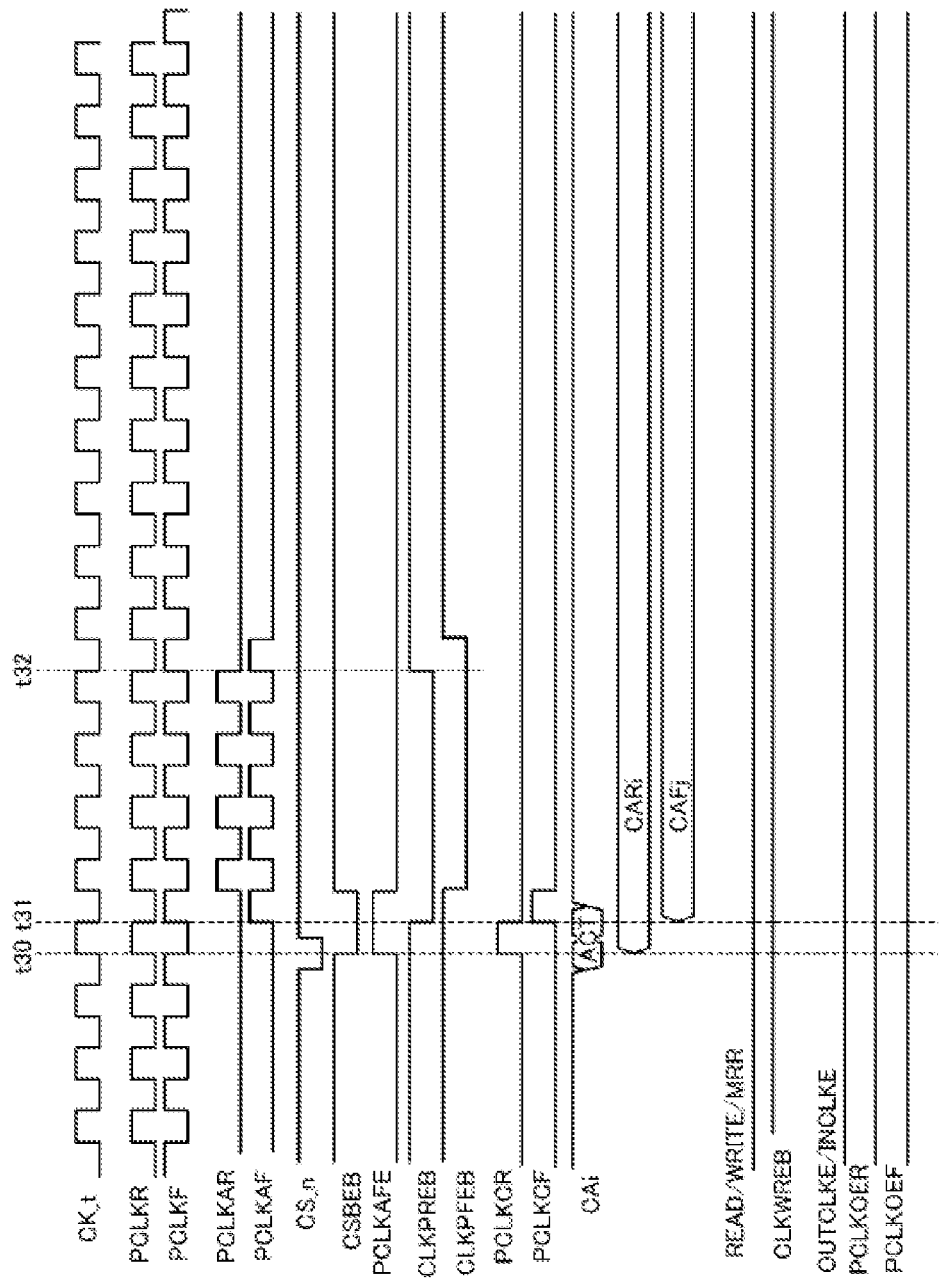
FIG. 16 is a timing chart showing operation when an active command has been issued from the outside.

FIG. 16 is a timing chart showing operation when an active command has been issued from the outside.

In the example shown in FIG. 16, the command address signal CAi is input at the times t30, t31, and this shows an active command. In this case, the clock signal buffer circuit 90 is placed in an enabled state due to the enable signal CLKPREB in the period of the times t31-t32 in response to activation of the chip select signal CS_n. As a result, the internal clock signals PCLKAR, PCLKAF can be generated only for the period required for the active operation for the memory cell array MA. It should be noted that an active operation for the memory cell array MA constitutes selection of a word line based on a row address.

Although not depicted, the operation when another command that does not accompany column access, e.g. a precharge command, has been issued is also the same as the operation shown in FIG. 16. It should be noted that when a precharge command is issued, the word line selected by the active operation is reset and the memory cell array MA returns to a precharge state.

As described above, according to this mode of embodiment, clocking of the internal clock signals PCLKAR, PCLKAF is started in response to activation of the chip select signal CS_n, and the internal clock signals PCLKAR, PCLKAF are clocked only for the required period commensurate with the type of command issued. As a result, it is possible to minimize the consumption of current from clocking the internal clock signals PCLKAR, PCLKAF.

A preferred mode of embodiment of the present invention was described above, but the present invention is not limited to the abovementioned mode of embodiment and various modifications may be made within a scope that does not depart from the essence of the present invention, and it goes without saying that any such modifications are included within the scope of the present invention.

KEY TO SYMBOLS

10 . . . Semiconductor device
20 . . . Clock signal generation circuit
21-23 . . . Receiver circuit
24 . . . Latch circuit
25, 26 . . . Gate circuit
30 . . . Chip select receiver circuit
31, 41 . . . Receiver circuit
40 . . . Command address receiver circuit
50 . . . Chip select latch circuit
51-53 . . . Latch circuit
54, 55 . . . Gate circuit
60 . . . Command address latch circuit
61-64 . . . Latch circuit
70 . . . Command decoder
71 . . . Decoding circuit unit
72-77 . . . Latch circuit
80 . . . Clock enable signal generation circuit
81-89 . . . Latch circuit
80F . . . First circuit portion
80R . . . Second circuit portion
90 . . . Clock signal buffer circuit
91, 92 . . . Gate circuit
100 . . . Latency control circuit
110 . . . Output clock generation circuit
120 . . . Input clock generation circuit
ACNT . . . Access control circuit
DCNT . . . Data control circuit
DLY1, DLY2 . . . Delay circuit
DQP . . . Data terminal
G1-G7 . . . Gate circuit
IB . . . Data input circuit
MA . . . Memory cell array
MR . . . Mode register
OB . . . Data output circuit

What is claimed is:

1. A semiconductor device comprising:
  a first circuit for generating a second clock signal in accordance with a first clock signal;
  a second circuit for generating an internal command signal synchronous with the second clock signal in accordance with an external command signal input synchronously with the first clock signal; and
  a third circuit for activating the first circuit throughout a predetermined period corresponding to the first period, in accordance with a chip select signal input synchronously with the first clock signal;
  wherein, when the external command signal exhibits a first value, the first circuit stops the second clock signal in response to a first period having elapsed from input of the external command signal, and when the external command signal exhibits a second value different than the first value, the first circuit stops the second clock signal in response to a second period longer than the first period having elapsed from input of the external command signal.

2. The semiconductor device as claimed in claim 1, wherein the first circuit starts to generate the second clock signal in response to activation of the chip select signal.

3. The semiconductor device as claimed in claim 2, wherein the first circuit continues to generate the second clock signal until the first period has elapsed from input of the external command signal, regardless of the value of the external command signal.

4. The semiconductor device as claimed in claim 1, further comprising a memory cell array having a plurality of memory cells, wherein the first value of the external command signal includes at least one of an active command showing an active operation with respect to the memory cell array or a precharge command showing a precharge operation with respect to the memory cell array.

5. The semiconductor device as claimed in claim 1, further comprising a memory cell array having a plurality of memory cells, wherein the second value of the external command signal includes at least one of a read command showing a read operation with respect to the memory cell array or a write command showing a write operation with respect to the memory cell array.

6. The semiconductor device as claimed in claim 5, wherein the write command includes a first write command for which a precharge operation is not automatically performed with respect to the memory cell array after completion of a write operation, and a second write command for which a precharge operation is automatically performed after completion of the write operation;

wherein, when the external command signal exhibits the first write command, the first circuit stops the second clock signal in response to the second period having elapsed from input of the external command signal, and wherein, when the external command signal exhibits the second write command, the first circuit stops the second clock signal in response to a third period longer than the second period having elapsed from input of the external command signal.

7. The semiconductor device as claimed in claim 1, further comprising a mode register in which an operating mode of the semiconductor device is set, wherein the second value of the external command signal includes a mode register read command showing a read operation with respect to the mode register.

8. A semiconductor device comprising:
   a clock signal buffer circuit for starting generation of an internal clock signal in response to activation of a chip select signal; and
   an internal circuit which operates synchronously with the internal clock signal, wherein, when a command signal input synchronously with the chip select signal shows a predetermined command, the clock signal buffer circuit stops generation of the internal clock signal at a second timing, and when the command signal shows a different command than the predetermined command, the clock signal buffer circuit stops generation of the internal clock signal at a first timing which is earlier than the second timing.

9. The semiconductor device as claimed in claim 8, wherein the internal circuit includes a command decoder for decoding the command signal.

10. The semiconductor device as claimed in claim 8, further comprising a data output circuit for outputting read data, wherein the internal circuit includes an output clock generation circuit for supplying an output clock signal to the data output circuit.

11. The semiconductor device as claimed in claim 10, wherein the predetermined command includes a read command instructing output of the read data.

12. The semiconductor device as claimed in claim 8, further comprising a data input circuit for inputting write data, wherein the internal circuit includes an input clock generation circuit for supplying an input clock signal to the data input circuit.

13. The semiconductor device as claimed in claim 12, wherein the predetermined command includes a write command instructing input of the write data.

14. A semiconductor device comprising:
   a clock signal generation circuit for generating an internal clock on the basis of an external clock;
   a clock buffer circuit for buffering and outputting the internal clock; and
   a command decoding circuit for decoding a command supplied from the outside and generating a decoded signal, in accordance with the internal clock output from the clock buffer circuit, wherein the clock buffer circuit outputs the internal clock signal in accordance with a chip select signal, and stops output of the internal clock signal in accordance with the command decoded signal.

* * * * *